United States Patent
Wu et al.

(10) Patent No.: US 9,042,116 B2
(45) Date of Patent: May 26, 2015

(54) PRINTED CIRCUIT BOARD WITH DAUGHTERBOARD

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Hsin-Kuan Wu, New Taipei (TW); Hou-Yuan Chou, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 120 days.

(21) Appl. No.: 13/781,677

(22) Filed: Feb. 28, 2013

(65) Prior Publication Data

US 2013/0329393 A1 Dec. 12, 2013

(30) Foreign Application Priority Data

Jun. 8, 2012 (TW) .............................. 101211107 U

(51) Int. Cl.
*H05K 1/11* (2006.01)
*H05K 1/14* (2006.01)
*H05K 3/36* (2006.01)

(52) U.S. Cl.
CPC ................ *H05K 1/144* (2013.01); *H05K 1/141* (2013.01); *H05K 3/368* (2013.01); *H05K 2201/041* (2013.01); *H05K 2201/10363* (2013.01)

(58) Field of Classification Search
USPC ........... 361/767–772, 792–795; 174/262–264
See application file for complete search history.

(56) References Cited

U.S. PATENT DOCUMENTS

| 3,795,047 | A | * | 3/1974 | Abolafia et al. ................. 29/843 |
| 4,692,843 | A | * | 9/1987 | Matsumoto et al. ........... 361/792 |
| 4,818,728 | A | * | 4/1989 | Rai et al. ........................ 438/108 |
| 5,031,308 | A | * | 7/1991 | Yamashita et al. .............. 29/830 |
| 5,276,955 | A | * | 1/1994 | Noddin et al. ................... 29/593 |
| 6,501,157 | B1 | * | 12/2002 | Cobbley ......................... 257/669 |
| 2006/0163740 | A1 | * | 7/2006 | Ohno et al. ..................... 257/762 |

* cited by examiner

*Primary Examiner* — Tuan T Dinh
(74) *Attorney, Agent, or Firm* — Novak Druce Connolly Bove + Quigg LLP

(57) ABSTRACT

A printed circuit board includes a motherboard and a daughterboard. The motherboard includes at least one first signal pad and defines at least one via under the at least one first signal pad. The daughterboard includes at least one second signal pad and defines at least one via under the at least one second signal pad. The at least one first signal pad and the at least one second signal pad are sucked into the respective vias on the motherboard and the daughterboard according to siphon principle to allow each of the first signal pads and the second signal pads to form uneven top surfaces, the uneven top surfaces of the at least one first signal pads and the at least one second signal pads are connected to each other for electronically connecting the daughterboard to the motherboard.

2 Claims, 3 Drawing Sheets

PRINTED CIRCUIT BOARD WITH DAUGHTERBOARD

BACKGROUND

1. Technical Field

The disclosure generally relates to printed circuit boards.

2. Description of the Related Art

Printed circuited board usually includes a plurality of layers stacked each other. The layers need to be interconnected via wiring.

When the printed circuit board needs more electronic signal routes, the printed circuit board has to add more layers. Thus, the cost of the printed circuit board is increased.

Therefore, there is room for improvement within the art.

BRIEF DESCRIPTION OF THE DRAWINGS

Many aspects of an exemplary printed circuit board with daughterboard can be better understood with reference to the following drawings. The components in the drawings are not necessarily drawn to scale, the emphasis instead being placed upon clearly illustrating the principles of the exemplary printed circuit board. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
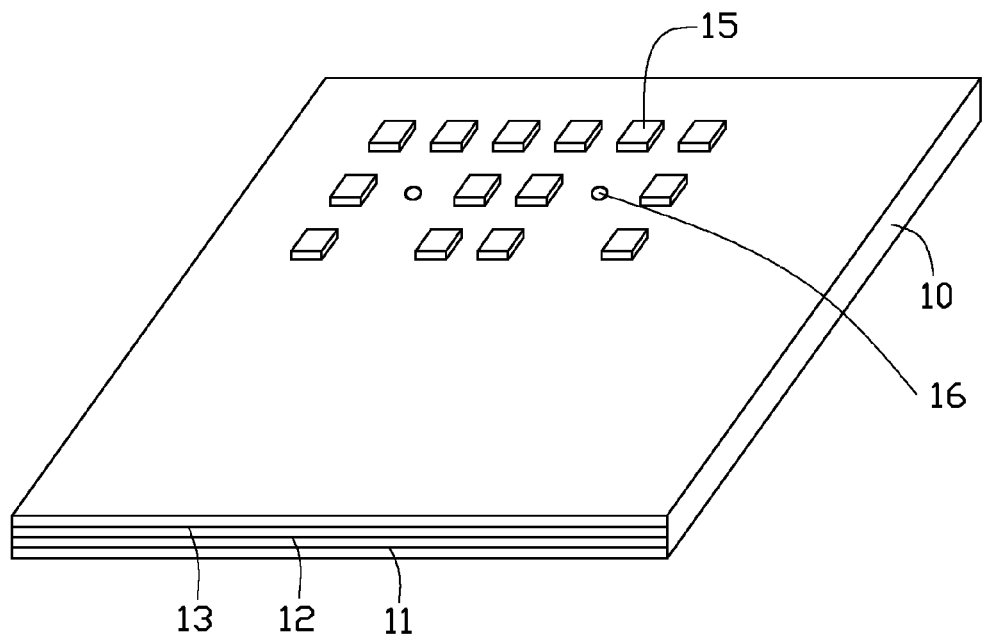
FIG. 1 is a schematic view of a printed circuit board with a motherboard and a daughterboard according to an exemplary embodiment.

FIG. 1 shows an exemplary embodiment of a printed circuit board 100. The printed circuit board 100 includes a motherboard 10 and a daughterboard 20 configured for being electronically connected to the motherboard 10.

The motherboard 10 is a multi-layer printed circuit board. In this exemplary embodiment, the motherboard 10 comprises a first wiring layer 11, a second wiring layer 12, and a third wiring layer 13. A first electronic signal routing is formed in the first wiring layer 11. A second electronic signal routing is formed in the second wiring layer 12. A third electronic signal routing is formed in the third wiring layer 13. At least one first ground pad 15 and at least one first signal pad 16 are located on a surface of the motherboard 10. In this exemplary embodiment, there is a plurality of first ground pads 15, and there are two first signal pads 16.

The daughterboard 20 is smaller than the motherboard 10. In this exemplary embodiment, the daughterboard 20 is also a multi-layer printed circuit board, and includes at least one second ground pad 21 and at least one second signal pad 22. In this exemplary embodiment, a plurality of second ground pads 21 and two second signal pads 22 are formed on a surface of the daughterboard 20. The arrangement of the second ground pads 21 corresponds to the first ground pads 21. The arrangement of the first signal pads 16 corresponds to the second signal pads 22. Each of the first ground pads 15 and the second ground pads 21 is substantially rectangular. Each of the first signal pads 16 and the second signal pads 22 is substantially circular, and each has a smaller area than each of the first ground pads 15 and the second ground pads 21.

To electronically connect the daughterboard 20 to the motherboard 10, the first ground pads 15 are bonded to the second ground pads 21, and the first signal pads 16 are bonded to the second signal pads 22. Thus, a fourth signal routing is formed between the motherboard 10 and the daughterboard 20. The present printed circuit board 100 does not need to add individual layers and only uses the daughterboard 20 to provide an extra signal routing. The design space of the printed circuit board 100 is greatly improved.

Figure 2:
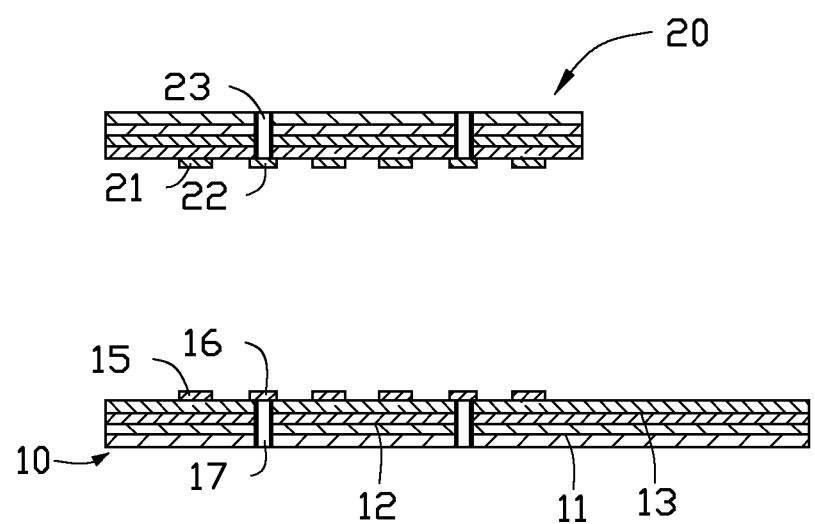
FIG. 2 is a cross sectional view of the motherboard and the daughterboard in an original state.

Since the first signal pads 16 and the second signal pads 22 have small areas, a potential for bad bonding exists. Referring to FIG. 2, to improve the connections between the first signal pads 16 and the second signal pads 22, a via is defined under each signal pad. In this exemplary embodiment, the motherboard 10 defines a via 17 under each first signal pad 16. The daughterboard 20 defines a via 23 under each second signal pad 22.

Figure 3:
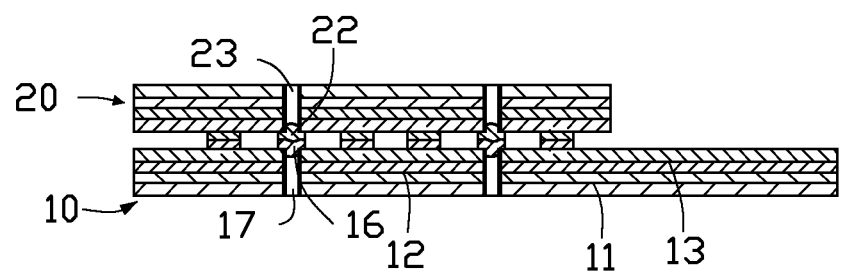
FIG. 3 is a cross sectional view of the motherboard and the daughterboard after being heated and bonded together.

When the daughterboard 20 and the motherboard 10 need to be connected, the daughterboard 20 and the motherboard 10 are heated to melt the first signal pads 16 and the second signal pads 22 together. Referring to FIG. 3, the siphon principle dictates that the vias 17 and 23 will suck the melted respective signal pads 16 and 22 into the vias 17 and 23 to allow each of first signal pads 16 and the second signal pads 22 to form uneven top surfaces. After the daughterboard 20 is pressed on the motherboard 10, the uneven top surfaces of the first signal pads 16 and 22 are then connected to each other. The uneven top surfaces greatly improve the integrity of the connection between the first signal pads 16 and the second signal pads 22.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. A printed circuit board comprising:
a motherboard comprising a plurality of wiring layers and at least one first signal pad, the motherboard defining at least one via under the at least one first signal pad;
a daughterboard comprising at least one second signal pad, the daughterboard defining at least one via under the at least one second signal pad;
wherein the at least one first signal pad and the at least one second signal pad are sucked into the respective vias on the motherboard and the daughterboard according to siphon principle to allow each of the first signal pads and the second signal pads to form uneven top surfaces, the uneven top surfaces of the at least one first signal pads and the at least one second signal pads are connected to each other for electronically connecting the daughterboard to the motherboard.

2. A printed circuit board comprising:
a motherboard comprising a plurality of wiring layers and a first signal pad, the motherboard defining a via under the first signal pad;
a daughterboard comprising a second signal pad, the daughterboard defining a via under the second signal pad;
wherein the first signal pad and the second signal pad are sucked into the respective vias on the motherboard and the daughterboard according to siphon principle to allow the first signal pad and the second signal pad to form uneven top surfaces, the uneven top surfaces of the first signal pad and the second signal pad are connected to each other for electronically connecting the daughterboard to the motherboard.

\* \* \* \* \*